(12) United States Patent  
Shiokawa et al.

(10) Patent No.: US 10,763,430 B2  
(45) Date of Patent: Sep. 1, 2020

(54) METHOD FOR STABILIZING SPIN ELEMENT AND METHOD FOR MANUFACTURING SPIN ELEMENT

(71) Applicant: TDK CORPORATION, Tokyo (JP)

(72) Inventors: Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 178 days.

(21) Appl. No.: 16/082,483

(22) PCT Filed: Feb. 28, 2018

(86) PCT No.: PCT/JP2018/007646  
§ 371 (c)(1),  
(2) Date: Sep. 5, 2018

(87) PCT Pub. No.: WO2019/167198  
PCT Pub. Date: Sep. 6, 2019

(65) Prior Publication Data  
US 2019/0267541 A1    Aug. 29, 2019

(51) Int. Cl.  
*H01L 43/14* (2006.01)  
*H01L 27/22* (2006.01)  
(Continued)

(52) U.S. Cl.  
CPC ............ *H01L 43/14* (2013.01); *H01L 27/222* (2013.01); *H01L 43/04* (2013.01); *H01L 43/06* (2013.01); *H01L 43/10* (2013.01)

(58) Field of Classification Search  
CPC .............. G11C 11/1675; G11C 11/161; G11C 11/1659; G11C 11/5607; G11C 27/00;  
(Continued)

(56) References Cited

U.S. PATENT DOCUMENTS 8,350,347 B2    1/2013  Gaudin et al.  
9,941,468 B2 *  4/2018  Fukami .................. H01L 43/10  
(Continued)

FOREIGN PATENT DOCUMENTS

JP          5441005 B2      3/2014  
WO     2016/021468 A1      2/2016

OTHER PUBLICATIONS

Fukami et al; "A spin-orbit torque switching scheme with collinear magnetic easy axis and current configuration"; Nature Nanotechnology; DOI:10.1038/NNANO.2016.29; pp. 1-6; Mar. 21, 2016.  
(Continued)

*Primary Examiner* — Savitri Mulpuri  
(74) *Attorney, Agent, or Firm* — Oliff PLC (57) ABSTRACT

In the method for stabilizing a spin element according to an aspect of the disclosure, the spin element includes a current-carrying part extending in a first direction, and an element part laminated on one surface of the current-carrying part and including a ferromagnetic material, in the case where the environmental temperature is a predetermined temperature, a pulse current having a current density of $1.0 \times 10^7$ A/cm$^2$ or more and $1.0 \times 10^9$ A/cm$^2$ or less and a pulse width within a predetermined range is applied at least a predetermined number of times in the first direction of the current-carrying part at intervals of a predetermined waiting time.

13 Claims, 6 Drawing Sheets

(51) Int. Cl.
*H01L 43/10* (2006.01)
*H01L 43/06* (2006.01)
*H01L 43/04* (2006.01)

(58) Field of Classification Search
CPC ....... G11C 11/1673; G11C 7/04; G11C 11/18; H01L 27/226; H01L 43/08; H01L 43/06; H01L 43/10; H01L 43/14; H01L 43/04; H01L 27/222; H01L 27/228; H01F 10/329; H01F 10/3254
See application file for complete search history.

(56) References Cited

U.S. PATENT DOCUMENTS

| | | | |
|---|---|---|---|
| 10,211,394 B1 * | 2/2019 | Inokuchi | H01L 43/02 |
| 10,438,641 B2 * | 10/2019 | Sasaki | G11C 7/04 |
| 2011/0129691 A1 | 6/2011 | Ishiwata et al. | |
| 2015/0348606 A1 | 12/2015 | Buhrman et al. | |
| 2017/0222135 A1 * | 8/2017 | Fukami | H01L 27/105 |
| 2018/0301199 A1 * | 10/2018 | Sasaki | H01L 43/08 |
| 2019/0267064 A1 * | 8/2019 | Shiokawa | H01F 10/329 |

OTHER PUBLICATIONS

Kato et al.; "Observation of the Spin Hall Effect in Semiconductors"; Science; vol. 306; pp. 1910-1913; Dec. 10, 2004.

Miron et al.; "Perpendicular switching of a single ferromagnetic layer induced by in-plane current injection;" Nature; vol. 476; pp. 189-194; Aug. 11, 2011.

Liu et al; "Spin torque switching with the giant spin Hall effect of tantalum;" Science; Mar. 13, 2012.

Liu et al.; "Current-Induced Switching of Perpendicularly Magnetized Magnetic Layers Using Spin Torque from the Spin Hall Effect;" Physical Review Letters; vol. 109; pp. 096602-1-096602-5; Aug. 31, 2012.

Lee et al.; "Threshold current for switching of a perpendicular magnetic layer induced by spin Hall effect;" Applied Physics Letters; vol. 102; 112410-1 to 112410-5, Mar. 20, 2013.

Lee et al.; "Thermally activated switching of perpendicular magnet by spin-orbit spin torque;" Applied Physics Letters; vol. 104; p. 072413-1 to 072413-5, Feb. 21, 2014.

Fukami et al.; "Magnetization switching by spin-orbit torque in an antiferromagnet bilayer system;" Natuer Materials; vol. 15; pg. 535-542, Feb. 15, 2016.

Takahashi et al.; "Spin injection and detection in magnetic nanostructures;" Physical Review B; vol. 67; p. 352409-1 to 052409-4, Feb. 28, 2003.

Seo et al.; "Area-Efficient SOT-MRAM With a Schottky Diode;" IEE Electron Device Letters; vol. 37; No. 8; pp. 982-985; Aug. 2016.

Zhang et al.; "Spin Hall Effects in Metallic Antiferromagnets;" Physical Review Letters; vol. 113; p. 196602-1 to 196602-6, Nov. 4, 2014.

Sato et al.; "Perpendicular-anisotropy CoFeB—MgO magnetic tunnel junctions with a MgO/CoFeB/Ta/CoFeB/MgO recording structure;" Applied Physics Letters; p. 022414-1 to 022414-4, vol. 101; Jul. 13, 2012.

* cited by examiner

METHOD FOR STABILIZING SPIN ELEMENT AND METHOD FOR MANUFACTURING SPIN ELEMENT

TECHNICAL FIELD

The present disclosure relates to a method for stabilizing a spin element and a method for manufacturing a spin element.

BACKGROUND ART

Giant magnetoresistance (GMR) elements formed of a multi-layer film of a ferromagnetic layer and a non-magnetic layer, and tunnel magnetoresistance (TMR) elements using an insulating layer (tunnel barrier layer or barrier layer) as a non-magnetic layer have been known as an element using a change in resistance value (change in magnetoresistance) based on a change of a relative angle formed by the magnetization of two ferromagnetic layers.

In recent years, spin-orbit-torque type magnetoresistance effect elements using spin-orbit torque (SOT), and domain wall type magnetic recording elements using the movement of a magnetic domain wall have attracted attention among spin elements using a change in magnetoresistance.

For example, Non-Patent Document 1 describes a spin-orbit-torque type magnetoresistance effect element. SOT is induced by the pure spin currents generated by a spin-orbit interaction or the Rashba effect at an interface of different kinds of materials. The current for inducing SOT in the magnetoresistance effect element flows in a direction intersecting a lamination direction of the magnetoresistance effect element. There is no need to allow a current to flow in the lamination direction of the magnetoresistance effect element, and the life of the magnetoresistance effect element is expected to be increased.

Patent Document 1 describes a domain wall type magnetic recording element. In the domain wall type magnetic recording element, the resistance value changes in stages by the movement of a magnetic domain wall in a magnetic recording layer. Multivalued data recording can be performed by changing the resistance value in stages. In addition, data recording can be performed in analog form, not digital form of "0" and "1".

PRIOR ART DOCUMENTS

Patent Document

Patent Document 1: Japanese Patent No. 5441005

Non-Patent Document

Non-Patent Document 1: S. Fukami, T. Anekawa, C. Zhang, and H. Ohno, Nature Nano Tec (2016). DOI: 10.1038/NNANO. 2016. 29.

SUMMARY

These spin elements perform data recording based on a low-resistance state in which the resistance value is low and a high-resistance state in which the resistance value is high. In order to increase data stability, the resistance values in the low-resistance state and in the high-resistance state of the spin element are required to be constant.

The present disclosure is contrived in view of the above-described circumstances, and the present disclosure provides a method for stabilizing a spin element which can stabilize the resistance values in a low-resistance state and in a high-resistance state, and a method for manufacturing a spin element using the method for stabilizing a spin element.

The inventors have conducted intensive studies, and as a result, they found that the resistance values in a low-resistance state and in a high-resistance state vary between when an initial writing operation is performed on a spin element and after a plurality of writing operations is performed. This difference may cause a problem from the viewpoint of actual product shipment. For example, a problem occurs in that the resistance as a threshold of data recording of "0" and "1" upon shipment fluctuates while a user uses the spin element. For example, in order to realize a semi-permanent writable element, it is required to guarantee approximately $10^{15}$ write times. In the case where a threshold as a reference fluctuates while the element is in use, reliability of recorded data is reduced.

Accordingly, the inventors have conducted intensive studies, and as a result, they found that the resistance values in a low-resistance state and in a high-resistance state are stabilized in the case where the number of write times exceeds a predetermined condition. In general, it has been thought that in the case where a current is applied to a wiring a plurality of times, the resistance value increases (the wiring deteriorates) due to migration or the like. However, this result shows that the resistance value is stabilized by applying a predetermined amount of current to a current-carrying part under predetermined conditions, and is an astonishing fact.

That is, the disclosure provides the following solutions for solving the problems.

(1) In a method for stabilizing a spin element according to a first aspect, the spin element includes: a current-carrying part extending in a first direction; and an element part laminated on one surface of the current-carrying part and including a ferromagnetic material, and in the case where an environmental temperature is 20° C. or higher and lower than 50° C., a pulse current having a current density of $1.0 \times 10^7$ A/cm$^2$ or more and $1.0 \times 10^9$ A/cm$^2$ or less and a pulse width of 1 nsec or more and 100 nsec or less is applied $10^8$ times or more in the first direction of the current-carrying part at intervals of a waiting time 10 or more times longer than the pulse width of the pulse current to be applied.

(2) In a method for stabilizing a spin element according to a second aspect, the spin element includes: a current-carrying part extending in a first direction; and an element part laminated on one surface of the current-carrying part and including a ferromagnetic material, and in the case where an environmental temperature is 50° C. or higher and 200° C. or lower, a pulse current having a current density of $1.0 \times 10^7$ A/cm$^2$ or more and $1.0 \times 10^9$ A/cm$^2$ or less and a pulse width of 1 nsec or more and 100 nsec or less is applied $10^7$ times or more in the first direction of the current-carrying part at intervals of a waiting time 10 or more times longer than the pulse width of the pulse current to be applied.

(3) In a method for stabilizing a spin element according to a third aspect, the spin element includes: a current-carrying part extending in a first direction; and an element part laminated on one surface of the current-carrying part and including a ferromagnetic material, and in the case where an environmental temperature is −100° C. or higher and lower than 20° C., a pulse current having a current density of $1.0 \times 10^7$ A/cm$^2$ or more and $1.0 \times 10^9$ A/cm$^2$ or less and a pulse width of 10 nsec or more and 1 μsec or less is applied $10^7$ times or more in the first direction of the current-carrying part at intervals of a waiting time equal to or longer than the pulse width of the pulse current to be applied.

(4) In the method for stabilizing a spin element according to the aspects, a constituent element of the current-carrying part may have activation energy of 200 kJ/mol or greater.

(5) In the method for stabilizing a spin element according to the aspects, the current-carrying part may be a spin-orbit torque wiring, and the element part may include a first ferromagnetic layer, a second ferromagnetic layer, and a non-magnetic layer interposed therebetween.

(6) In the method for stabilizing a spin element according to the aspects, the current-carrying part may be a magnetic recording layer including a magnetic domain wall, and the element part may include a non-magnetic layer and a third ferromagnetic layer in this order from the magnetic recording layer side.

(7) In the method for stabilizing a spin element according to the aspects, in an array element in which a plurality of the spin elements exist, the spin element to which a pulse current is applied at an n-th time and the spin element to which a pulse current is applied at an n+1-th time may be changed.

(8) A method for manufacturing a spin element according to a fourth aspect includes the steps of: forming an element part including a ferromagnetic material on one surface of a current-carrying part extending in a first direction; and carrying a pulse current to the current-carrying part according to the method for stabilizing a spin element of the aspect.

According to a method for stabilizing a spin element and a method for manufacturing a spin element of this embodiment, it is possible to stabilize the resistance values in a low-resistance state and in a high-resistance state.

EMBODIMENTS FOR CARRYING OUT THE DISCLOSURE

Hereinafter, embodiments will be described in detail by properly referring to the drawings. The drawings used in the following description may show characteristic portions in an enlarged manner for convenience to make it easier to understand the characteristics, and dimension ratios or the like of the respective constituent elements may be different from actual ones. Materials, dimensions, and the like exemplified in the following description are just an example, and the disclosure is not limited thereto. Accordingly, the disclosure can be properly modified and embodied within a range where the effects of the disclosure are exhibited.

In a method for stabilizing a spin element according to this embodiment, in the case where the environmental temperature is a predetermined temperature, a pulse current having a current density of $1.0 \times 10^7$ A/cm$^2$ or more and $1.0 \times 10^9$ A/cm$^2$ or less and a predetermined pulse width is applied to a spin element at least a predetermined number of times at intervals of a predetermined waiting time. That is, this is a method of stabilizing a resistance value of the spin element by imparting at least a predetermined amount of energy to the spin element. First, examples of the spin element will be described.

(Spin-Orbit-Torque Type Magnetoresistance Effect Element)

Figure 1:
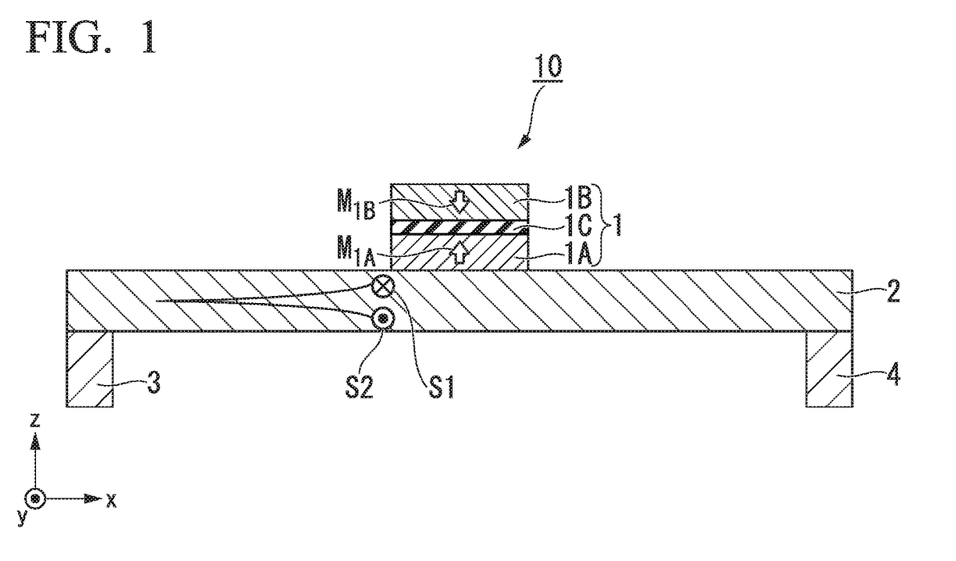
FIG. 1 is a schematic cross-sectional view of a spin-orbit-torque type magnetoresistance effect element which is an example of a spin element according to an embodiment.

FIG. 1 is a schematic cross-sectional view of a spin-orbit-torque type magnetoresistance effect element 10 which is an example of a spin element according to this embodiment. The spin-orbit-torque type magnetoresistance effect element 10 shown in FIG. 1 includes an element part 1 and a spin-orbit torque wiring (current-carrying part) 2. A first electrode 3 and a second electrode 4 having conductivity are positioned so as to sandwich the element part 1 therebetween in the spin-orbit torque wiring 2.

Hereinafter, a description will be given while a first direction in which the current-carrying part extends is specified as an x-direction, a lamination direction (second direction) of the element part 1 is specified as a z-direction, and a direction orthogonal to both of the x-direction and the z-direction is specified as a y-direction.

<Spin-Orbit Torque Wiring>

The spin-orbit torque wiring 2 extends in the x-direction. The spin-orbit torque wiring 2 is connected to one surface of the element part 1 in the z-direction. The spin-orbit torque wiring 2 may be connected to the element part 1 directly or via another layer.

The spin-orbit torque wiring 2 includes a material which generates a spin current by a spin hall effect in the case where a current I flows. As such a material, any material may be used as long as it is configured to generate a spin current in the spin-orbit torque wiring 2. Accordingly, the material is not limited to materials composed of a single element, and materials composed of a portion consisting of a material easily generating a spin current and a portion consisting of a material hardly generating a spin current may be used.

The spin hall effect is a phenomenon in which in the case where a current I flows to a material, a spin current is induced in a direction orthogonal to the direction of the current I based on a spin-orbit interaction. The mechanism of the generation of a spin current by the spin hall effect will be described.

In the case where a potential difference is imparted to both ends of the spin-orbit torque wiring 2, a current I flows along the spin-orbit torque wiring 2. In the case where the current I flows, a first spin S1 oriented in one direction and a second spin S2 oriented in the opposite direction of the first spin S1 are bent in a direction orthogonal to the current, respectively. For example, the first spin S1 is bent in the z-direction with respect to the proceeding direction, and the second spin S2 is bent in the −z-direction with respect to the proceeding direction.

The usual hall effect and the spin hall effect have a characteristic in common in that the moving direction of moving electric charges (electrons) can be bent. The usual hall effect and the spin hall effect are greatly different from each other in that regarding the usual hall effect, charged particles moving in a magnetic field receive the Lorentz force, and thus the moving direction thereof can be bent, and regarding the spin hall effect, the moving direction of the spin can be bent just by moving electrons (just by allowing a current to flow) even in the case where no magnetic field exists.

In a non-magnetic material (a material which is not a ferromagnetic material), the number of electrons of the first spin S1 and the number of electrons of the second spin S2 are the same, and thus the number of electrons of the first spin S1 in the +z-direction and the number of electrons of the second spin S2 in the −z-direction in the drawing are the same. In this case, flows of electric charges are mutually offset, and thus the current amount becomes zero. Particularly, the spin current without an accompanying current is referred to as a pure spin current.

In the case where the flow of electrons of the first spin S1 is represented by $J_\uparrow$, the flow of electrons of the second spin S2 is represented by $J_\downarrow$, and the spin current is represented by $J_S$, $J_S=J_\uparrow-J_\downarrow$ is defined. The spin current $J_S$ flows in the z-direction in the drawing. In FIG. 1, a first ferromagnetic layer 1A to be described later is provided on an upper surface of the spin-orbit torque wiring 2. Therefore, a spin is injected to the first ferromagnetic layer 1A.

The spin-orbit torque wiring 2 consists of any of a metal, an alloy, an intermetallic compound, a metal boride, a metal carbide, a metal silicide, and a metal phosphide having a function of generating a spin current by the spin hall effect when a current flows.

It is preferable that the main component of the spin-orbit torque wiring 2 be a non-magnetic heavy metal. The heavy metal means a metal having a specific gravity equal to or greater than that of yttrium. The non-magnetic heavy metal is preferably a non-magnetic metal having a large atomic number of 39 or larger and having a d-electron or an f-electron in an outermost shell. In the non-magnetic metal, the spin-orbit interaction causing the spin hall effect is large.

In general, electrons move in the opposite direction of a current regardless of the orientation of electron spin. In the non-magnetic metal having a large atomic number and having a d-electron or an f-electron in an outermost shell, the spin-orbit interaction is large, and the spin hall effect strongly acts. Therefore, the moving direction of the electrons depends on the orientation of electron spin. Accordingly, a spin current $J_S$ is easily generated in the non-magnetic heavy metal.

In addition, the spin-orbit torque wiring 2 may contain a magnetic metal. The magnetic metal refers to a ferromagnetic metal or an antiferromagnetic metal. In the case where the non-magnetic metal contains a small amount of magnetic metal, this causes spin scattering. In the case where spin scattering occurs, the spin-orbit interaction is strengthened, and thus the efficiency of generation of a spin current with respect to a current is increased. The main component of the spin-orbit torque wiring 2 may consist of an antiferromagnetic metal.

In the case where the amount of the magnetic metal added is excessively increased, the generated spin current is scattered by the added magnetic metal, and as a result, the spin current reducing action may be strongly exhibited. Therefore, the molar ratio of the magnetic metal to be added is preferably sufficiently lower than a total molar ratio of the constituent elements of the spin-orbit torque wiring. The molar ratio of the magnetic metal to be added is preferably 3% or less of the total.

The spin-orbit torque wiring 2 may contain a topological insulator. The topological insulator is a substance in which the inside of the substance is an insulator or a high-resistance material, but a spin-polarized metallic state is generated in a surface thereof. In this substance, an internal magnetic field is generated by the spin-orbit interaction. Accordingly, a new topological phase is exhibited by the effect of the spin-orbit interaction without an external magnetic field. This is a topological insulator, and can generate a pure spin current with high efficiency by the strong spin-orbit interaction and the breakage of reversal symmetry at an edge.

Preferable examples of the topological insulator include SnTe, $Bi_{1.5}Sb_{0.5}Te_{1.7}Se_{1.3}$, $TlBiSe_2$, $Bi_2Te_3$, $Bi_{1-x}Sb_x$, and $(Bi_{1-x}Sb_x)_2Te_3$. These topological insulators can generate a spin current with high efficiency.

<Element Part>

The element part 1 includes a first ferromagnetic layer 1A, a second ferromagnetic layer 1B, and a non-magnetic layer 1C interposed therebetween. The element part 1 is laminated in the second direction (z-direction) intersecting the spin-orbit torque wiring 2.

The resistance value of the element part 1 changes by a change of a relative angle formed by magnetization $M_{1A}$ of the first ferromagnetic layer 1A and magnetization $M_{1B}$ of the second ferromagnetic layer 1B. The magnetization $M_{1B}$ of the second ferromagnetic layer 1B is fixed in one direction (z-direction), and the direction of the magnetization $M_{1A}$ of the first ferromagnetic layer 1A relatively changes with respect to the magnetization $M_{1B}$. The second ferromagnetic layer 1B may be expressed as a fixed layer, a reference layer, or the like, and the first ferromagnetic layer 1A may be expressed as a free layer, a recording layer, or the like. In the case where this is applied to a coercivity-differed type (pseudo spin valve type) MRAM, the coercivity of the second ferromagnetic layer 1B is made larger than that of the first ferromagnetic layer 1A. In the case where this is applied to an exchange bias type (spin valve type) MRAM, the magnetization $M_{1B}$ of the second ferromagnetic layer 1B is fixed by exchange coupling with the antiferromagnetic layer.

In the case where the non-magnetic layer 1C consists of an insulator, the element part 1 has a similar configuration to a tunnel magnetoresistance effect (TMR: tunneling magnetoresistance) element, and in the case where the non-magnetic layer 1C consists of a metal, the element part 1 has a similar configuration to a giant magnetoresistance effect (GMR: giant magnetoresistance) element.

As the lamination configuration of the element part 1, a lamination configuration of a known magnetoresistance effect element can be employed. For example, each layer may consist of a plurality of layers, and other layers such as an antiferromagnetic layer for fixing the magnetization direction of the second ferromagnetic layer 1B and the like may be provided. The second ferromagnetic layer 1B is referred to as a fixed layer or a reference layer, and the first ferromagnetic layer 1A is referred to as a free layer or a storage layer.

The first ferromagnetic layer 1A and the second ferromagnetic layer 1B may be perpendicular magnetization films in which easy axes of the magnetization $M_{1A}$ and the magnetization $M_{1B}$ are oriented in the z-direction, or in-plane magnetization films in which easy axes of magnetization are oriented in an x-y in-plane direction. In addition, the magnetization $M_{1A}$ and the magnetization $M_{1B}$ may be inclined with respect to any one or all of the X-direction, the Y-direction, and the Z-direction.

A ferromagnetic material can be applied to the first ferromagnetic layer 1A and the second ferromagnetic layer 1B. For example, a metal selected from the group consisting of Cr, Mn, Co, Fe, and Ni, an alloy containing one or more of the above-described metals, or an alloy containing the above-described metals and at least one element of B, C, and N can be used. Specific examples thereof include Co—Fe, Co—Fe—B, and Ni—Fe. In the case where the first ferromagnetic layer 1A is an in-plane magnetization film, for example, a Co—Ho alloy ($CoHo_2$), a Sm—Fe alloy ($SmFe_{12}$), or the like is preferably used.

In the case where a Heusler alloy such as $Co_2FeSi$ or the like is used for the first ferromagnetic layer 1A and the second ferromagnetic layer 1B, a strong magnetoresistance effect can be exhibited. The Heusler alloy contains an intermetallic compound having a chemical composition of XYZ or $X_2YZ$ where X represents a Co, Fe, Ni, or Cu-group transition metal element or noble metal element in the periodic table, Y represents a Mn, V, Cr, or Ti-group transition metal or an element represented by X, and Z represents a typical element in Groups III to V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-c}Ga_c$.

A layer consisting of an antiferromagnetic material such as IrMn or PtMn may be laminated on the second ferromagnetic layer 1B. By providing a synthetic ferromagnetic coupling structure, the influence of a leakage magnetic field of the second ferromagnetic layer 1B on the first ferromagnetic layer 1A can be reduced.

A known material can be used for the non-magnetic layer 1C.

For example, in the case where the non-magnetic layer 1C consists of an insulator (the non-magnetic layer 1C is a tunnel barrier layer), $Al_2O_3$, $SiO_2$, MgO, $MgAl_2O_4$, or the like can be used as a material thereof. In addition, a material in which a part of Al, Si, or Mg is substituted with Zn, Be, or the like can also be used. Among these, MgO or $MgAl_2O_4$ is a material which can realize coherent tunneling, and thus a spin can be efficiently injected. In the case where the non-magnetic layer 1C consists of a metal, Cu, Au, Ag, or the like can be used as a material thereof. In the case where the non-magnetic layer 1C consists of a semiconductor, Si, Ge, $CuInSe_2$, $CuGaSe_2$, $Cu(In, Ga)Se_2$, or the like can be used as a material thereof.

The element part 1 may include other layers. An underlayer may be provided on a surface of the first ferromagnetic layer 1A opposite to the non-magnetic layer 1C. It is preferable that the layer to be disposed between the spin-orbit torque wiring 2 and the first ferromagnetic layer 1A does not dissipate the spin transmitted from the spin-orbit torque wiring 2. For example, silver, copper, magnesium, and aluminum are known to have a long spin diffusion length of 100 nm or longer and to hardly dissipate the spin.

The thickness of this layer is preferably equal to or smaller than the spin diffusion length of the constituent substance of the layer. In the case where the thickness of the layer is equal to or smaller than the spin diffusion length, the spin transmitted from the spin-orbit torque wiring 2 can be sufficiently transmitted to the first ferromagnetic layer 1A.

(Domain Wall Type Magnetic Recording Element)

Figure 2:
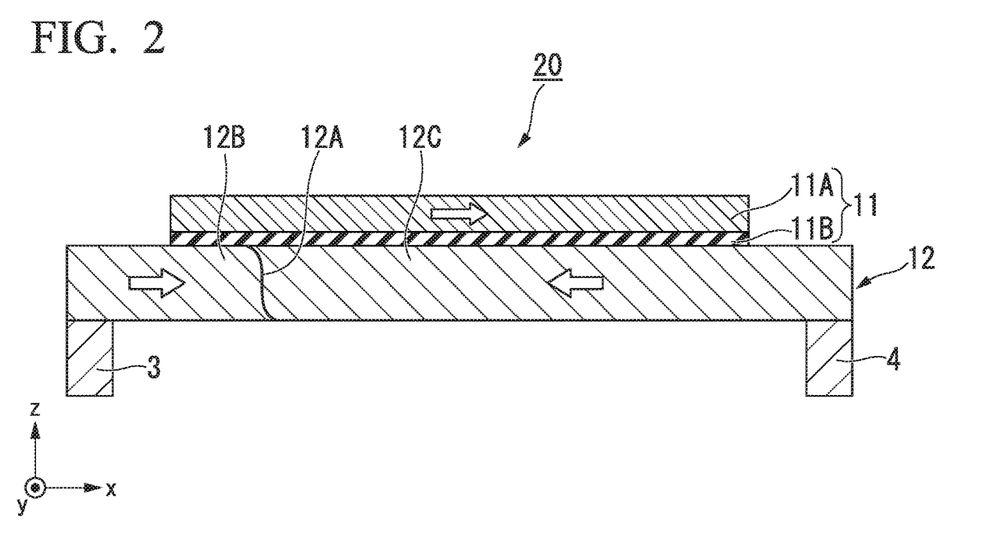
FIG. 2 is a schematic cross-sectional view of a domain wall type magnetic recording element which is an example of a spin element according to an embodiment.

FIG. 2 is a schematic cross-sectional view of a domain wall type magnetic recording element 20 which is an example of a spin element according to this embodiment. The domain wall type magnetic recording element 20 shown in FIG. 2 includes an element part 11 and a magnetic recording layer (current-carrying part) 12. A first electrode 3 and a second electrode 4 having conductivity are positioned so as to sandwich the element part 11 therebetween in the magnetic recording layer 12.

<Element Part>

The element part 11 includes a first ferromagnetic layer 11A and a non-magnetic layer 11B. As the first ferromagnetic layer 11A and the non-magnetic layer 11B, materials similar to those in the spin-orbit-torque type magnetoresistance effect element 10 shown in FIG. 1 can be used.

<Magnetic Recording Layer>

The magnetic recording layer 12 extends in an x-direction. The magnetic recording layer 12 includes a magnetic domain wall 12A therein. The magnetic domain wall 12A is a boundary between a first magnetic domain 12B and a second magnetic domain 12C which have magnetization in mutually opposite directions. In the domain wall type magnetic recording element 20 shown in FIG. 2, the first magnetic domain 12B has magnetization oriented in a +x-direction, and the second magnetic domain 12C has magnetization oriented in a −x-direction.

The domain wall type magnetic recording element 20 records data on a multi-valued basis by the position of the magnetic domain wall 12A of the magnetic recording layer 12. The data recorded on the magnetic recording layer 12 is read as a change in resistance value in the lamination direction of the first ferromagnetic layer 11A and the magnetic recording layer 12. In the case where the magnetic domain wall 12A is moved, a ratio between the first magnetic domain 12B and the second magnetic domain 12C in the magnetic recording layer 12 changes. The magnetization of the first ferromagnetic layer 11A is in the same direction as (parallel to) the magnetization of the first magnetic domain 12B, and in the opposite direction of (anti-parallel to) the magnetization of the second magnetic domain 12C. In the case where the magnetic domain wall 12A is moved in the x-direction, and the area of the first magnetic domain 12B in a portion where the first magnetic domain overlaps with the first ferromagnetic layer 11A when viewed from the z-direction increases, the resistance value of the domain wall type magnetic recording element 20 is reduced. On the contrary, in the case where the magnetic domain wall 12A is moved in the −x-direction, and the area of the second magnetic domain 12C in a portion where the second magnetic domain overlaps with the first ferromagnetic layer 11A when viewed from the z-direction increases, the resistance value of the domain wall type magnetic recording element 20 is increased. The resistance value of the domain wall type magnetic recording element 20 is measured between an upper electrode electrically connected to the first ferromagnetic layer 11A and either one of the first electrode 3 or the second electrode 4.

The magnetic domain wall 12A is moved by allowing a current to flow in the extending direction of the magnetic recording layer 12 or applying an external magnetic field.

For example, in the case where a current pulse is applied from the first electrode 3 to the second electrode 4, the first magnetic domain 12B widens toward the second magnetic domain 12C, and the magnetic domain wall 12A is moved toward the second magnetic domain 12C. That is, by setting the direction and the intensity of the current which flows to the first electrode 3 and the second electrode 4, the position of the magnetic domain wall 12A is controlled, and data is written on the domain wall type magnetic recording element 20.

The magnetic recording layer 12 consists of a magnetic material. As the magnetic material which forms the magnetic recording layer 12, a material similar to the first ferromagnetic layer 11A can be used. In addition, the magnetic recording layer 12 preferably includes at least one element selected from the group consisting of Co, Ni, Pt, Pd, Gd, Tb, Mn, Ge, and Ga. For example, a lamination film of Co and Ni, a lamination film of Co and Pt, a lamination film of Co and Pd, a MnGa-based material, a GdCo-based material, or a TbCo-based material can be used. A ferrimagnetic material such as a MnGa-based material, a GdCo-based material, or a TbCo-based material has small saturation magnetization, and thus can lower a threshold current necessary for moving the magnetic domain wall. A lamination film of Co and Ni, a lamination film of Co and Pt, or a lamination film of Co and Pd has large coercivity, and thus can restrict the moving rate of the magnetic domain wall.

Specific examples of the predetermined spin element have been described as above. The spin-orbit-torque type magnetoresistance effect element 10 and the domain wall type magnetic recording element 20 have a characteristic in common in that a writing current is allowed to flow to the current-carrying parts 2 and 12 extending in a direction intersecting the element parts 1 and 11, respectively, in data writing. The spin element is not limited to the spin-orbit-torque type magnetoresistance effect element 10 and the domain wall type magnetic recording element 20 as long as it is a three-terminal type spin element which allows a writing current to flow to a current-carrying part extending in a direction intersecting an element part in data writing.

The three-terminal type spin element includes a current-carrying part extending in a first direction, and an element part including a non-magnetic layer and a ferromagnetic layer and laminated on one surface of the current-carrying part. In the three-terminal type spin element, a current is allowed to flow along the current-carrying part to perform data writing, a current is allowed to flow between the element part and one end of the current-carrying part to perform data reading. The three-terminal type spin element includes two terminals for applying a writing current, which are positioned so as to sandwich the element part therebetween in the current-carrying part, and one terminal for applying a reading current, which is in an end surface of the element part opposite to the current-carrying part.

<Method for Stabilizing Spin Element>

As described above, a method for stabilizing a spin element according to this embodiment is a method of stabilizing a resistance value of the spin element by imparting at least a predetermined amount of energy to the spin element.

In the case where the environmental temperature is 20° C. or higher and lower than 50° C., a pulse current having a current density of $1.0 \times 10^7$ A/cm$^2$ or more and $1.0 \times 10^9$ A/cm$^2$ or less and a pulse width of 1 nsec or more and 100 nsec or less is applied $10^8$ times or more in the x-direction of the current-carrying parts 2 and 12 at intervals of a waiting time 10 or more times longer than the pulse width of the pulse current to be applied.

In the case where the environmental temperature is 50° C. or higher and 200° C. or lower, a pulse current having a current density of $1.0 \times 10^7$ A/cm$^2$ or more and $1.0 \times 10^9$ A/cm$^2$ or less and a pulse width of 1 nsec or more and 100 nsec or less is applied $10^7$ times or more in the x-direction of the current-carrying parts 2 and 12 at intervals of a waiting time 10 or more times longer than the pulse width of the pulse current to be applied. In the case where the environmental temperature is 50° C. or higher and 200° C. or lower, the number of times of application of the pulse current is reduced as compared to the case where the environmental temperature is 20° C. or higher and lower than 50° C.

In the case where the environmental temperature is −100° C. or higher and lower than 20° C., a pulse current having a current density of $1.0 \times 10^7$ A/cm$^2$ or more and $1.0 \times 10^9$ A/cm$^2$ or less and a pulse width of 10 nsec or more and 1 μsec or less is applied $10^7$ times or more in the x-direction of the current-carrying parts 2 and 12 at intervals of a waiting time equal to or longer than the pulse width of the pulse current to be applied. In the case where the environmental temperature is −100° C. or higher and lower than 20° C., the pulse width of the pulse current can be increased as compared to the case where the environmental temperature is 20° C. or higher and lower than 50° C.

The environmental temperature is a temperature of the spin-orbit-torque type magnetoresistance effect element 10, and more specifically, a temperature of the spin-orbit torque wiring 2.

In the case where a pulse current is applied so as to satisfy the above-described relationship in each temperature region, the resistance values in a low-resistance state and in a high-resistance state of the spin element are stabilized. The reason for this is thought to be that in the case where a current is applied to the current-carrying part, processing damages such as voids and defects existing in the current-carrying part, oxygen adsorption, and the like are removed, and thus the wiring resistance of the current-carrying part is stabilized.

In addition, activation energy Q of the constituent element of the current-carrying part is preferably 200 kJ/mol or greater. Examples of the element satisfying the above-described condition include V, Fe, Co, Ge, Nb, Rh, Pd, Ta, W, Ir, and Pt. The larger the activation energy, the less the electromigration occurs. It is possible to avoid an increase of the overall resistance of the current-carrying part due to excessive electromigration in the current-carrying part.

In an array element in which a plurality of spin elements exist, it is preferable that a spin element to which a pulse current is applied at an n-th time and a spin element to which a pulse current is applied at an n+1-th time be changed. In the case where a pulse current is applied continuously to one spin element, the spin element generates heat. Accordingly, the next pulse current is applied after at least a predetermined waiting time as described above. In the case where spin elements to which a current is applied at an n-th time and at an n+1-th time, respectively, are changed, during a waiting time for one element, a pulse current can be applied to another element, and thus the process can be efficiently performed.

<Method for Manufacturing Spin Element>

A method for manufacturing a spin element according to this embodiment includes a step of forming an element part including a ferromagnetic material on one surface of a current-carrying part extending in a first direction, and a step of carrying a pulse current to the current-carrying part according to the above-described method for stabilizing a spin element.

The spin element can be produced using a technology such as photolithography regardless of a case where the spin element is a spin-orbit-torque type magnetoresistance effect element 10 (FIG. 1) or a domain wall type magnetic recording element (FIG. 2).

For example, in the case where the spin element is a spin-orbit-torque type magnetoresistance effect element, it is produced according to the following procedures. First, through-holes are formed in a substrate and filled with a conductive material to produce the first electrode 3 and the second electrode 4. Next, a layer to be a base for the spin-orbit torque wiring 2 which is a current-carrying part is laminated and processed on the wiring using photolithography techniques. Finally, a layer to be a base for the first ferromagnetic layer 1A, a layer to be a base for the non-magnetic layer 1C, and a layer to be a base for the second ferromagnetic layer 1B are laminated in sequence, and the element part 1 is processed using photolithography techniques.

In the case where the spin element is the domain wall type magnetic recording element 20, the only difference is the configuration of layers to be laminated in the production of the element part 11. Therefore, the domain wall type magnetic recording element 20 can be produced according to similar procedures to the above-described steps.

The spin element may be individually produced, or multiple (a plurality of) elements may be collectively produced on a wafer. It is preferable that multiple elements be collectively produced on a wafer from the viewpoint of manufacturing efficiency.

Next, a pulse current is carried to the current-carrying part according to the above-described method for stabilizing a spin element. A pulse current may be carried in a state in which a plurality of elements exists on a wafer, or after each element produced on the wafer is made into a chip. In order to increase the manufacturing efficiency, a pulse current is preferably applied to the respective elements in a state in which the elements exist on a wafer. In order to suppress the heat generation, a pulse current is preferably applied to the respective elements existing on a wafer in order.

As described above, according to the method for stabilizing a spin element of this embodiment, the resistance values in a low-resistance state and in a high-resistance state of the spin element can be stabilized. In addition, by providing the method for stabilizing a spin element according to this embodiment in the manufacturing process, spin elements of which the resistance values in a low-resistance state and in a high-resistance state are stabilized from the shipment stage can be supplied to a market, and thus the product reliability can be increased.

The preferable embodiments of the disclosure have been described in detail, but the disclosure is not limited to specific embodiments, and can be variously deformed and changed within the ranges of the features of the disclosure described in the claims.

EXAMPLES

Example 1

A spin-orbit-torque type magnetoresistance effect element 10 shown in FIG. 1 was produced. Specifically, a layer to be a spin-orbit torque wiring 2 was laminated on a substrate in which a first electrode 3 and a second electrode 4 consisting of Au were provided. As the layer to be a spin-orbit torque wiring 2, 3 nm of Ta was laminated. The layer to be a spin-orbit torque wiring 2 was processed to have a wiring shape by photolithography; and thereby, a spin-orbit torque wiring 2 was produced. The spin-orbit torque wiring 2 had a width of 0.2 μm in a y-direction and a length of 0.7 μm in an x-direction. Ta forming the spin-orbit torque wiring 2 had activation energy of 414 kJ/mol.

Next, an interlayer insulating film consisting of $SiO_2$ was formed to fill a periphery of the spin-orbit torque wiring 2, and a layer to be a base for a first ferromagnetic layer 1A, a layer to be a base for a non-magnetic layer 1C, and a layer to be a base for a second ferromagnetic layer 1B were laminated thereon. These were processed by photolithography to produce an element part 1 having a predetermined shape at a central position in the x-direction of the spin-orbit torque wiring 2.

The specific configuration of the element part 1 was as follows.

First Ferromagnetic Layer 1A: CoFeB, 0.8 nm
Non-Magnetic Layer 1C: MgO, 2.5 nm
Second Ferromagnetic Layer 1B: CoFeB, 1.0 nm In order to improve thermal stability, Ru (0.42 nm) and [Co (0.4 nm)/Pt (0.8 nm)]$_n$ were laminated on the second ferromagnetic layer 1B to provide a synthetic structure.

Finally, an interlayer insulating film consisting of $SiO_2$ was formed to fill a side surface of the element part 1, and Au was laminated as an upper electrode on the second ferromagnetic layer 1B of the element part 1.

A pulse current was applied at an environmental temperature of 20° C. between the first electrode 3 and the second electrode 4 of the spin-orbit-torque type magnetoresistance effect element 10 produced according to the above-described procedures. The applied pulse current had a current density of $1.0 \times 10^7$ A/cm$^2$ and a pulse width of 1 nsec. In the application of the pulse current, the waiting time was 100 nsec.

Figure 3:
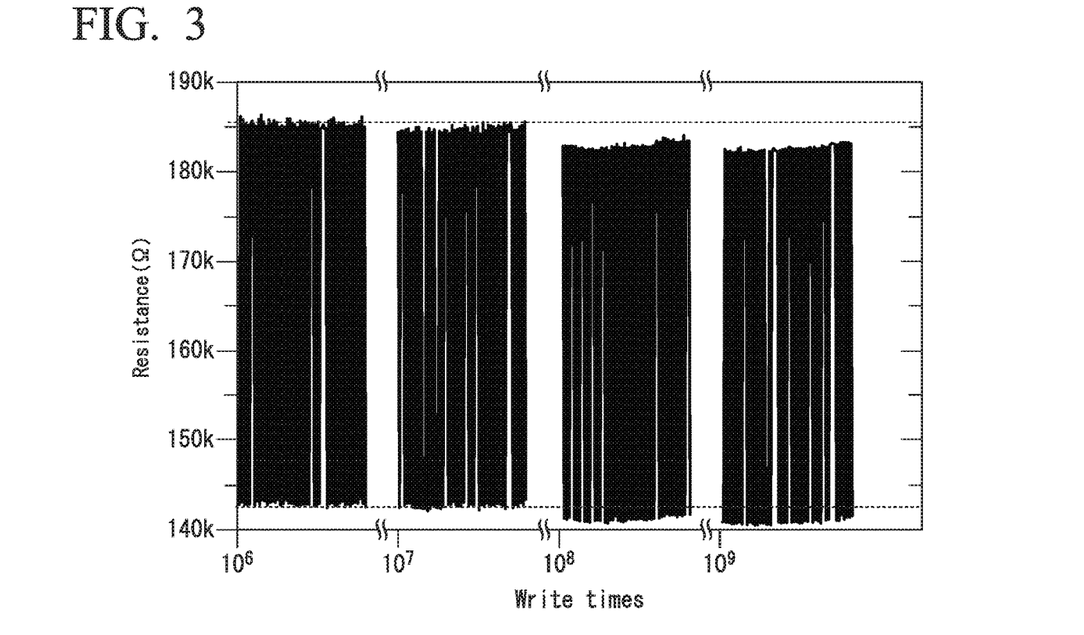
FIG. 3 is a diagram showing a change in resistance value for every writing of a spin-orbit-torque type magnetoresistance effect element according to Example 1.
Figure 4:
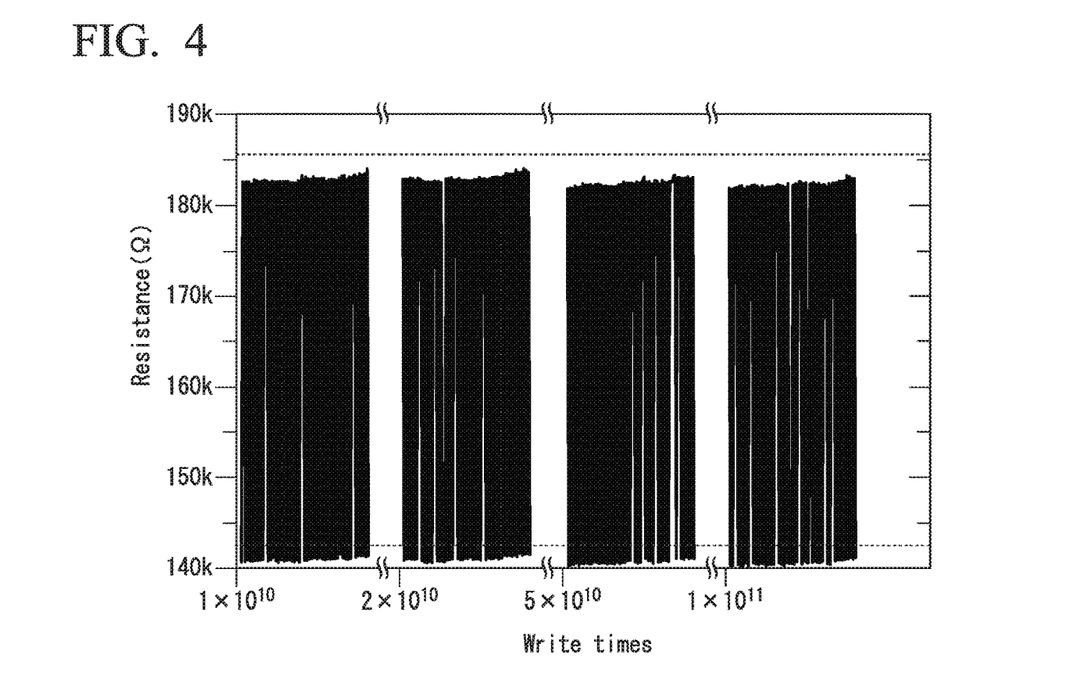
FIG. 4 is a diagram showing a change in resistance value for every writing of the spin-orbit-torque type magnetoresistance effect element according to Example 1.

A change in resistance value between the first ferromagnetic layer 1A and the first electrode 3 was measured. The measurement was performed at initial 100 write times when the number of digits of the number of write times was changed. After the number of write times exceeded $1 \times 10^{11}$, the measurement was performed at initial 100 write times every $10^{11}$th writing. The results are shown in FIGS. 3 and 4. FIG. 3 shows results of writing performed $1 \times 10^6$ to $1 \times 10^{10}$ times, and FIG. 4 shows results of writing performed $1 \times 10^{10}$ to $1 \times 10^{11}$ times. As shown in FIG. 3, at the time when the writing was performed $1 \times 10^8$ times, the resistance values in a low-resistance state and in a high-resistance state of the spin-orbit-torque type magnetoresistance effect element 10 were stabilized. The upper and lower limit values of the resistance values did not greatly fluctuate even at the time when the writing was performed $1 \times 10^{11}$ times.

That is, it can be said that the resistance value of the spin-orbit-torque type magnetoresistance effect element 10 is stabilized in the case where the writing is performed $1 \times 10^8$ times or more under an environment temperature of 20° C. or higher. In addition, it can be said that even in the case where a current having a current density of $1.0 \times 10^7$ A/cm$^2$ or greater is applied, the resistance value of the spin-orbit-torque type magnetoresistance effect element 10 is stabilized in the case where the writing is performed $1 \times 10^8$ times or more. It can also be said that even in the case where the pulse width is 1 nsec or greater, the resistance value of the spin-orbit-torque type magnetoresistance effect element 10 is stabilized in the case where the writing is performed $1 \times 10^8$ times or more.

Example 2

Example 2 is different from Example 1 in that the environmental temperature at which a pulse current was applied was 50° C. Other conditions were the same as Example 1.

Figure 5:
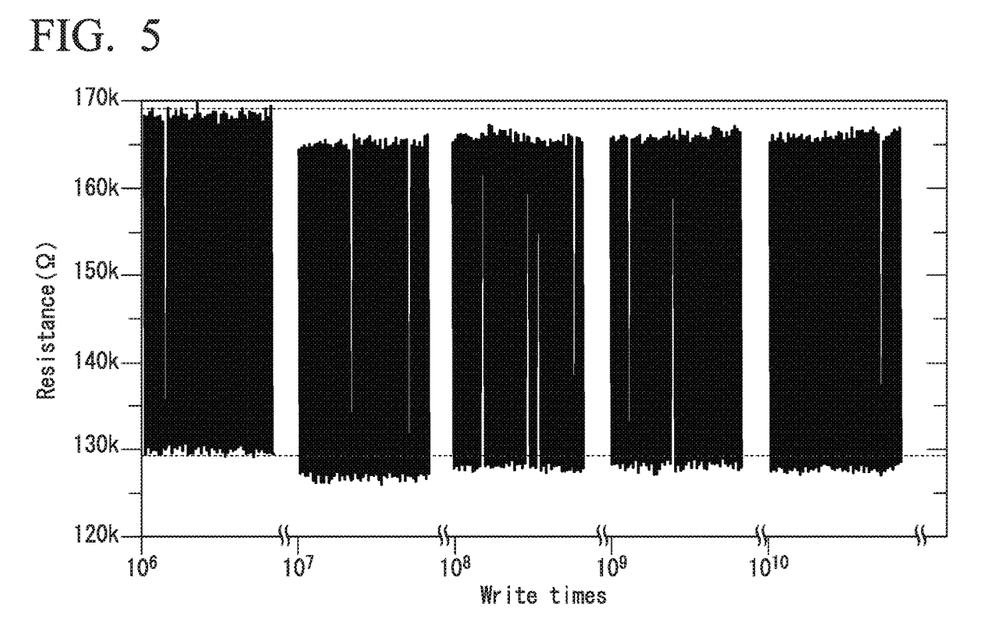
FIG. 5 is a diagram showing a change in resistance value for every writing of a spin-orbit-torque type magnetoresistance effect element according to Example 2.

The results are shown in FIG. 5. FIG. 5 shows results of writing performed $1\times10^6$ to $1\times10^{10}$ times. The measurement was performed at initial 100 write times when the number of digits of the number of write times was changed. As shown in FIG. 5, at the time when the writing was performed $1\times10^7$ times, the resistance values in a low-resistance state and in a high-resistance state of the spin-orbit-torque type magnetoresistance effect element 10 were stabilized. The upper and lower limit values of the resistance values did not greatly fluctuate even at the time when the writing was performed $1\times10^{10}$ times.

That is, it can be said that the resistance value of the spin-orbit-torque type magnetoresistance effect element 10 is stabilized in the case where the writing is performed $1\times10^7$ times or more under an environment temperature of 50° C. or higher. In addition, it can be said that even in the case where a current having a current density of $1.0\times10^7$ A/cm$^2$ or greater is applied, the resistance value of the spin-orbit-torque type magnetoresistance effect element 10 is stabilized in the case where the writing is performed $1\times10^7$ times or more. It can also be said that even in the case where the pulse width is 1 nsec or greater, the resistance value of the spin-orbit-torque type magnetoresistance effect element 10 is stabilized in the case where the writing is performed $1\times10^7$ times or more.

Example 3

Example 3 is different from Example 1 in that the environmental temperature at which a pulse current was applied was −100° C. In addition, Example 3 is different from Example 1 in that the pulse current to be applied had a pulse width of 10 nsec, and the waiting time in the application of the pulse current was 100 nsec. Other conditions were the same as Example 1.

Figure 6:
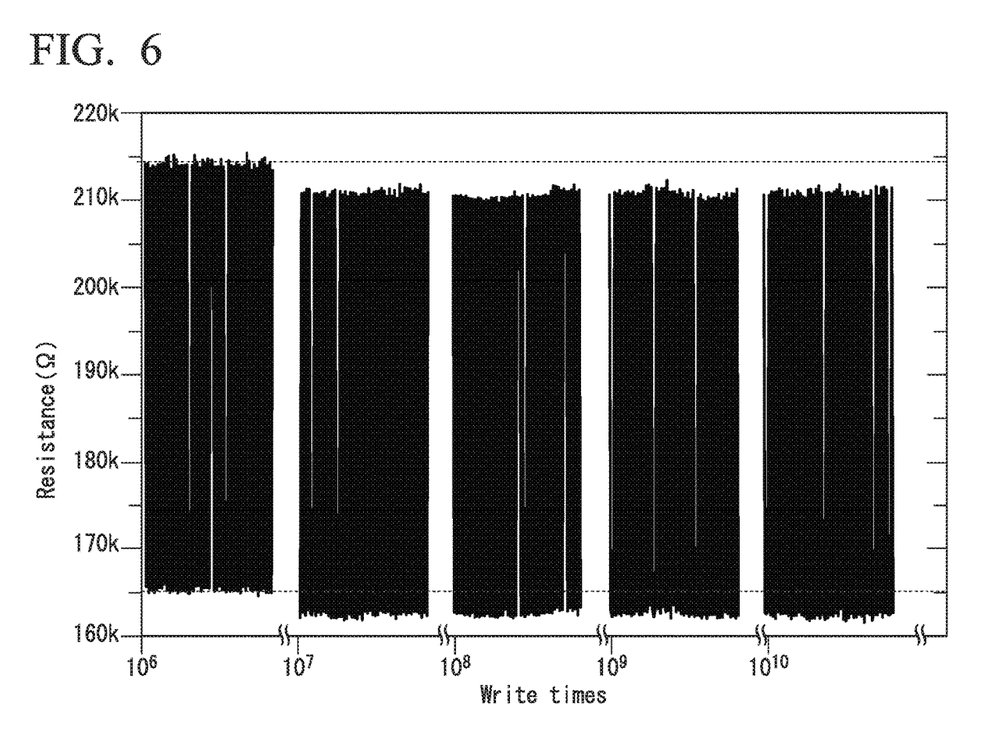
FIG. 6 is a diagram showing a change in resistance value for every writing of a spin-orbit-torque type magnetoresistance effect element according to Example 3.

The results are shown in FIG. 6. FIG. 6 shows results of writing performed $1\times10^6$ to $1\times10^{10}$ times. The measurement was performed at initial 100 write times when the number of digits of the number of write times was changed. As shown in FIG. 6, at the time when the writing was performed $1\times10^7$ times, the resistance values in a low-resistance state and in a high-resistance state of the spin-orbit-torque type magnetoresistance effect element 10 were stabilized. The upper and lower limit values of the resistance values did not greatly fluctuate even at the time when the writing was performed $1\times10^{10}$ times.

That is, it can be said that the resistance value of the spin-orbit-torque type magnetoresistance effect element 10 is stabilized in the case where the writing is performed $1\times10^7$ times or more under an environment temperature of −100° C. or higher. In addition, it can be said that even in the case where a current having a current density of $1.0\times10^7$ A/cm$^2$ or greater is applied, the resistance value of the spin-orbit-torque type magnetoresistance effect element 10 is stabilized in the case where the writing is performed $1\times10^7$ times or more. It can also be said that even in the case where the pulse width is 10 nsec or greater, the resistance value of the spin-orbit-torque type magnetoresistance effect element 10 is stabilized in the case where the writing is performed $1\times10^7$ times or more.

Examples 4 to 6

Examples 4 to 6 are different from Examples 1 to 3 in that the constituent material of the spin-orbit torque wiring 2 was changed to Pt. Pt has smaller activation energy than Ta used in Examples 1 to 3, and the activation energy is 279 kJ/mol. In addition, Pt is a material having a different spin hall angle polarity. Other conditions were the same as Examples 1 to 3. In Example 4, the environmental temperature was the same as that in Example 1, in Example 5, the environmental temperature was the same as that in Example 2, and in Example 6, the environmental temperature was the same as that in Example 3.

Figure 7:
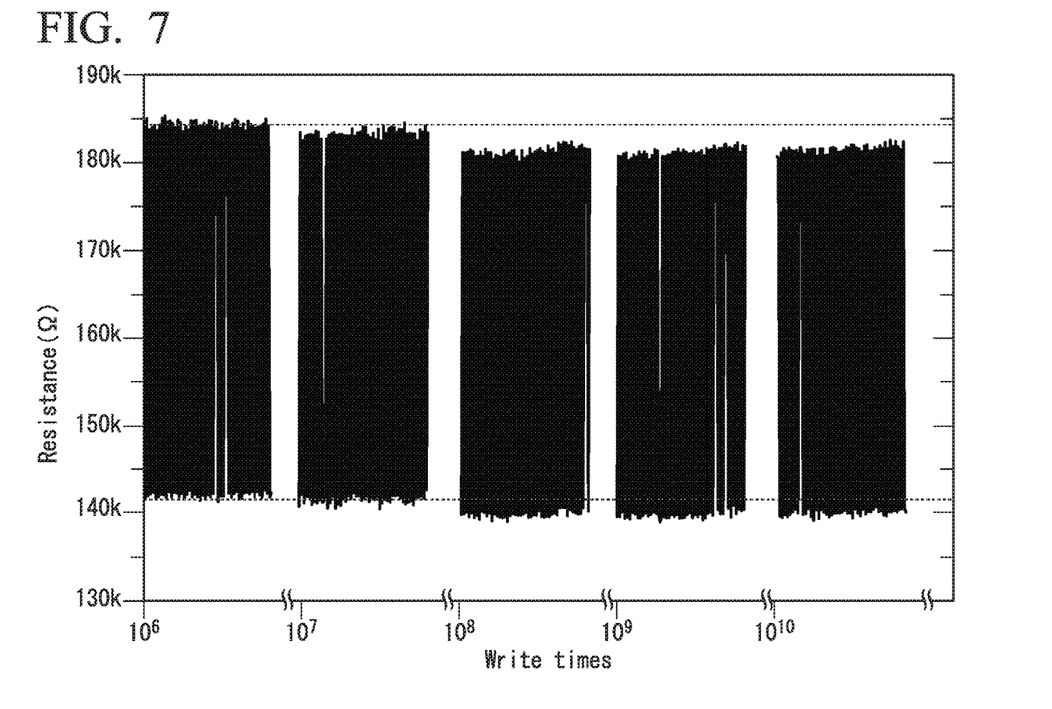
FIG. 7 is a diagram showing a change in resistance value for every writing of a spin-orbit-torque type magnetoresistance effect element according to Example 4.
Figure 8:
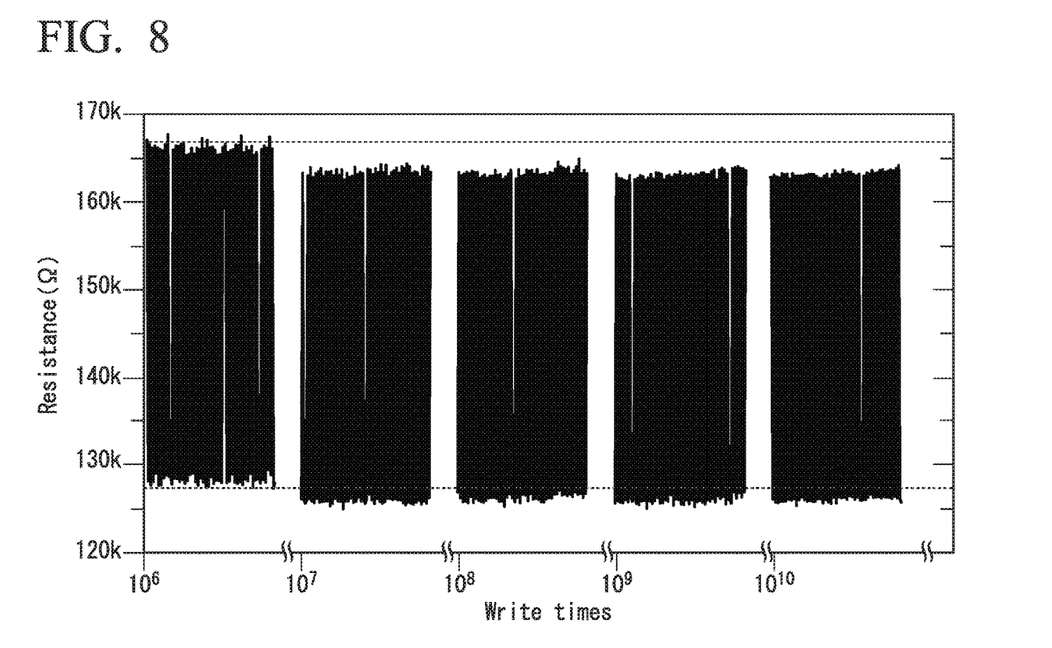
FIG. 8 is a diagram showing a change in resistance value for every writing of a spin-orbit-torque type magnetoresistance effect element according to Example 5.
Figure 9:
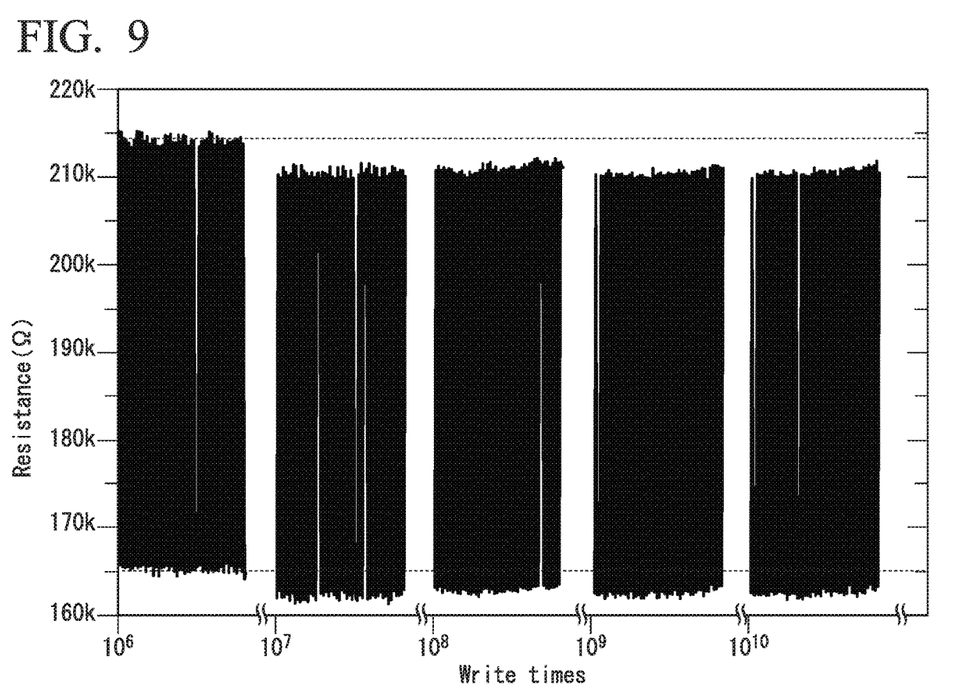
FIG. 9 is a diagram showing a change in resistance value for every writing of a spin-orbit-torque type magnetoresistance effect element according to Example 6.

The results are shown in FIGS. 7 to 9. FIG. 7 shows results of writing performed $1\times10^6$ to $1\times10^{10}$ times in Example 4. FIG. 8 shows results of writing performed $1\times10^6$ to $1\times10^{10}$ times in Example 5, and FIG. 9 shows results of writing performed $1\times10^6$ to $1\times10^{10}$ times in Example 6. The measurement was performed at initial 100 write times when the number of digits of the number of write times was changed.

At the time when the writing was performed $1\times10^8$ times at 20° C., the resistance value of the spin-orbit-torque type magnetoresistance effect element was stabilized (Example 4). At the time when the writing was performed $1\times10^8$ times at 50° C., the resistance value of the spin-orbit-torque type magnetoresistance effect element was stabilized (Example 5). At the time when the writing was performed $1\times10^7$ times at −100° C., the resistance value of the spin-orbit-torque type magnetoresistance effect element was stabilized (Example 6).

Example 7 to 9

Examples 7 to 9 are different from Examples 1 to 3 in that the constituent material of the spin-orbit torque wiring 2 was changed to W. W has larger activation energy than Ta used in Examples 1 to 3, and the activation energy is 622 kJ/mol. Other conditions were the same as Examples 1 to 3. In Example 7, the environmental temperature was the same as that in Example 1, in Example 8, the environmental temperature was the same as that in Example 2, and in Example 9, the environmental temperature was the same as that in Example 3.

Figure 10:
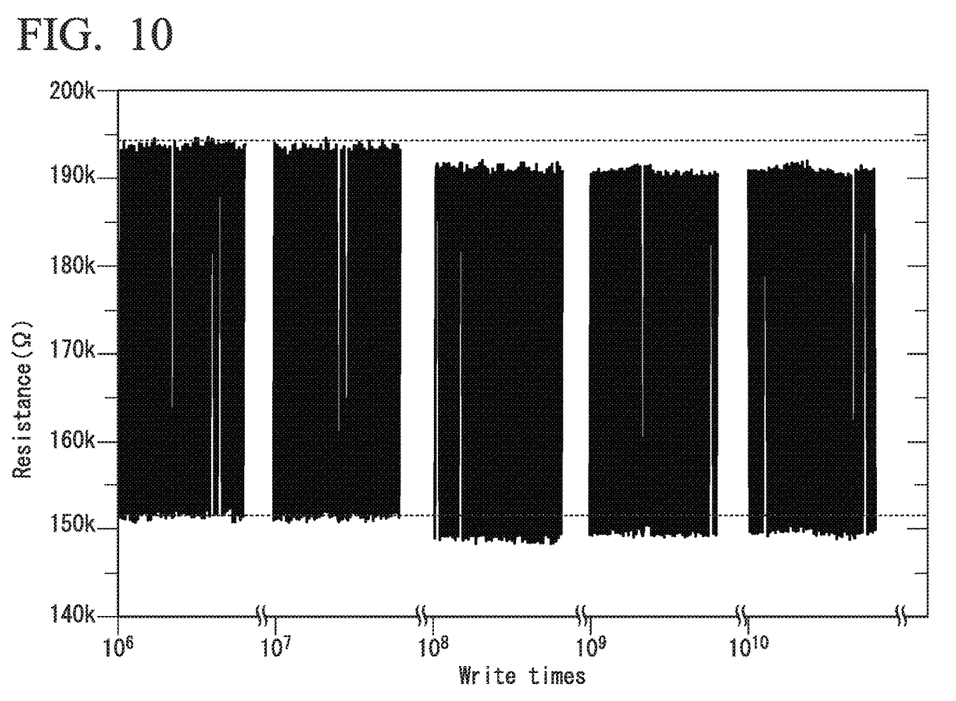
FIG. 10 is a diagram showing a change in resistance value for every writing of a spin-orbit-torque type magnetoresistance effect element according to Example 7.
Figure 11:
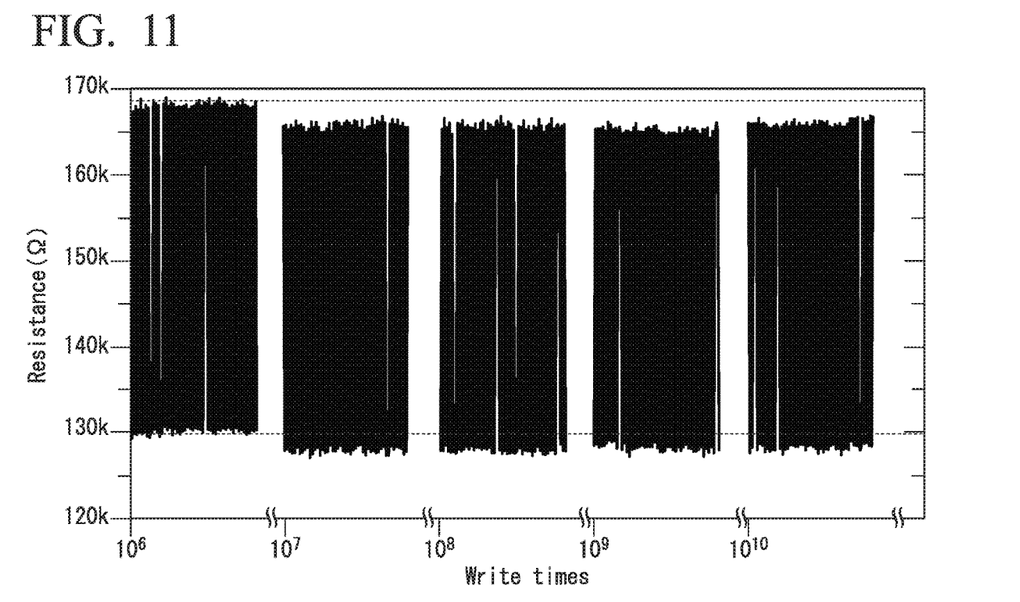
FIG. 11 is a diagram showing a change in resistance value for every writing of a spin-orbit-torque type magnetoresistance effect element according to Example 8.
Figure 12:
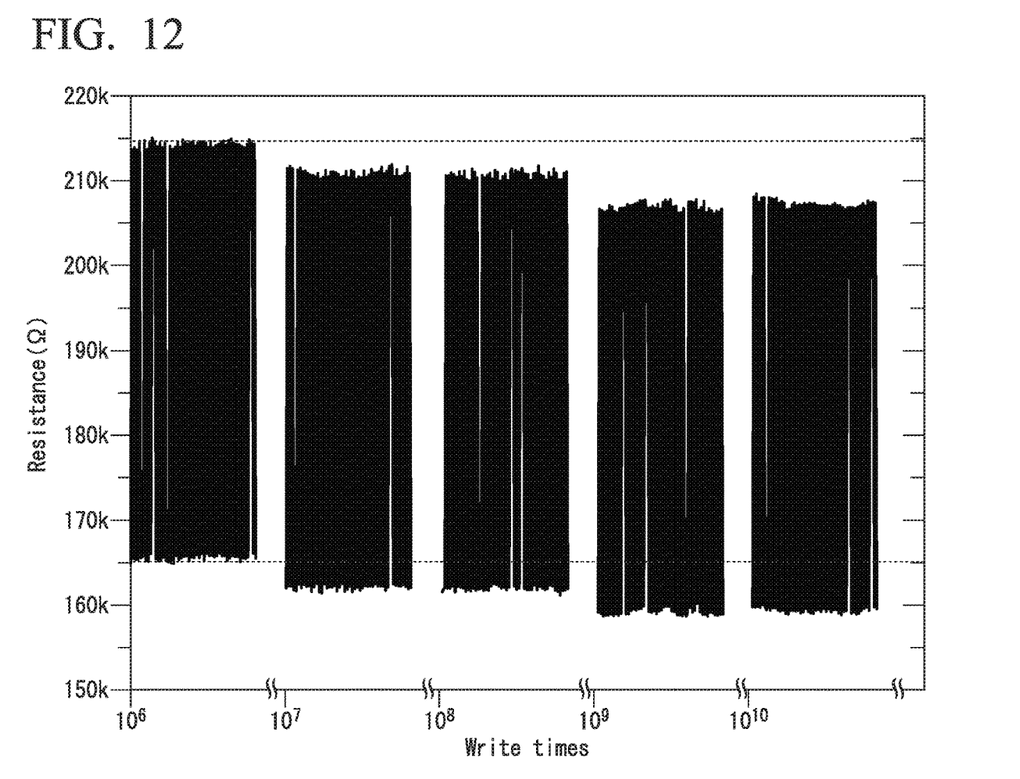
FIG. 12 is a diagram showing a change in resistance value for every writing of a spin-orbit-torque type magnetoresistance effect element according to Example 9.

The results are shown in FIGS. 10 to 12. FIG. 10 shows results of writing performed $1\times10^6$ to $1\times10^{10}$ times in Example 7. FIG. 11 shows results of writing performed $1\times10^6$ to $1\times10^{10}$ times in Example 8, and FIG. 12 shows results of writing performed $1\times10^6$ to $1\times10^{10}$ times in Example 9. The measurement was performed at initial 100 write times when the number of digits of the number of write times was changed.

At the time when the writing was performed $1\times10^8$ times at 20° C., the resistance value of the spin-orbit-torque type magnetoresistance effect element was stabilized (Example 7). At the time when the writing was performed $1\times10^8$ times at 50° C., the resistance value of the spin-orbit-torque type magnetoresistance effect element was stabilized (Example 8). At the time when the writing was performed $1\times10^7$ times at −100° C., the resistance value of the spin-orbit-torque type magnetoresistance effect element was stabilized (Example 9).

EXPLANATION OF REFERENCE SIGNS

1, 11: ELEMENT PART
1A, 11A: FIRST FERROMAGNETIC LAYER
1B: SECOND FERROMAGNETIC LAYER
1C, 11B: NON-MAGNETIC LAYER
2: SPIN-ORBIT TORQUE WIRING
3: FIRST ELECTRODE

4: SECOND ELECTRODE
10: SPIN-ORBIT-TORQUE TYPE MAGNETORESISTANCE EFFECT ELEMENT
12: MAGNETIC RECORDING LAYER
12A: MAGNETIC DOMAIN WALL
12B: FIRST MAGNETIC DOMAIN
12C: SECOND MAGNETIC DOMAIN
20: DOMAIN WALL TYPE MAGNETIC RECORDING ELEMENT

The invention claimed is:

1. A method for stabilizing a spin element, the spin element including: a current-carrying part extending in a first direction; and an element part laminated on one surface of the current-carrying part and including a ferromagnetic material,
the method comprising: applying a pulse current having a current density of $1.0 \times 10^7$ A/cm$^2$ or more and $1.0 \times 10^9$ A/cm$^2$ or less in the first direction of the current-carrying part,
wherein in the case where an environmental temperature is 20° C. or higher and lower than 50° C., a pulse width of the pulse current is 1 nsec or more and 100 nsec or less, and the pulse current is applied $10^8$ times or more at intervals of a waiting time 10 or more times longer than the pulse width of the pulse current to be applied,
in the case where an environmental temperature is 50° C. or higher and 200° C. or lower, a pulse width of the pulse current is 1 nsec or more and 100 nsec or less, and the pulse current is applied $10^7$ times or more at intervals of a waiting time 10 or more times longer than the pulse width of the pulse current to be applied, and
in the case where an environmental temperature is −100° C. or higher and lower than 20° C., a pulse width of the pulse current is 10 nsec or more and 1 μsec or less, and the pulse current is applied $10^7$ times or more at intervals of a waiting time equal to or longer than the pulse width of the pulse current to be applied.

2. The method for stabilizing a spin element according to claim 1,
wherein a constituent element of the current-carrying part has activation energy of 200 kJ/mol or greater.

3. The method for stabilizing a spin element according to claim 1,
wherein the current-carrying part is a spin-orbit torque wiring, and the element part includes a first ferromagnetic layer, a second ferromagnetic layer, and a non-magnetic layer interposed therebetween.

4. The method for stabilizing a spin element according to claim 1,
wherein the current-carrying part is a magnetic recording layer including a magnetic domain wall, and the element part includes a non-magnetic layer and a third ferromagnetic layer in this order from the magnetic recording layer side.

5. The method for stabilizing a spin element according to claim 1,
wherein in an array element in which a plurality of the spin elements exist, the spin element to which a pulse current is applied at an n-th time and the spin element to which a pulse current is applied at an n+1-th time are changed.

6. A method for manufacturing a spin element comprising the steps of:
forming an element part including a ferromagnetic material on one surface of a current-carrying part extending in a first direction; and
carrying a pulse current to the current-carrying part according to the method for stabilizing a spin element according to claim 1.

7. The method for stabilizing a spin element according to claim 2,
wherein the current-carrying part is a spin-orbit torque wiring, and the element part includes a first ferromagnetic layer, a second ferromagnetic layer, and a non-magnetic layer interposed therebetween.

8. The method for stabilizing a spin element according to claim 2,
wherein the current-carrying part is a magnetic recording layer including a magnetic domain wall, and the element part includes a non-magnetic layer and a third ferromagnetic layer in this order from the magnetic recording layer side.

9. The method for stabilizing a spin element according to claim 2,
wherein in an array element in which a plurality of the spin elements exist, the spin element to which a pulse current is applied at an n-th time and the spin element to which a pulse current is applied at an n+1-th time are changed.

10. The method for stabilizing a spin element according to claim 3,
wherein in an array element in which a plurality of the spin elements exist, the spin element to which a pulse current is applied at an n-th time and the spin element to which a pulse current is applied at an n+1-th time are changed.

11. The method for stabilizing a spin element according to claim 4,
wherein in an array element in which a plurality of the spin elements exist, the spin element to which a pulse current is applied at an n-th time and the spin element to which a pulse current is applied at an n+1-th time are changed.

12. The method for stabilizing a spin element according to claim 7,
wherein in an array element in which a plurality of the spin elements exist, the spin element to which a pulse current is applied at an n-th time and the spin element to which a pulse current is applied at an n+1-th time are changed.

13. The method for stabilizing a spin element according to claim 8,
wherein in an array element in which a plurality of the spin elements exist, the spin element to which a pulse current is applied at an n-th time and the spin element to which a pulse current is applied at an n+1-th time are changed.

* * * * *